United States Patent [19]

Shibasaki et al.

[11] Patent Number: 4,908,685
[45] Date of Patent: Mar. 13, 1990

[54] MAGNETOELECTRIC TRANSDUCER

[75] Inventors: Ichiro Shibasaki, Fuji; Takashi Kajino, Narashino, both of Japan

[73] Assignee: Asahi Kasei Kogyo Kabushiki Kaisha, Osaka, Japan

[21] Appl. No.: 325,129

[22] Filed: Mar. 15, 1989

Related U.S. Application Data

[63] Continuation of Ser. No. 948,053, Dec. 31, 1986.

[30] Foreign Application Priority Data

May 10, 1985 [JP] Japan ................................ 60-99395
May 10, 1985 [JP] Japan ................................ 60-99396
May 24, 1985 [JP] Japan ................................ 60-110155

[51] Int. Cl.$^4$ .......................................... H01L 27/22
[52] U.S. Cl. ............................. 357/27; 357/65; 357/67; 357/71
[58] Field of Search .................... 357/27, 67, 71, 65

[56] References Cited

U.S. PATENT DOCUMENTS 4,000,842  1/1977  Burns ............................ 357/71 X
4,081,601  3/1978  Dinella et al. ................... 174/68.5
4,296,424  10/1981 Shibasaki et al. .................. 357/1
4,609,936  9/1986  Scharr et al. ................... 357/71 X

FOREIGN PATENT DOCUMENTS 50126389  10/1979  Japan .

OTHER PUBLICATIONS

Ohshta, M., "Hall Generators made of InSb-Sn Films", Electrical Engineering in Japan, vol. 93, No. 3, 1973, pp. 112-116.
Sze, S. M., *Physics of Semiconductor Devices*, John Wiley & Sons, New York, 1981, p. 307.

Primary Examiner—Andrew J. James
Assistant Examiner—Sara W. Crane
Attorney, Agent, or Firm—Finnegan, Henderson, Farabow, Garrett & Dunner

[57] ABSTRACT

A magnetoelectric transducer comprising a group III-V compound semiconductor thin film 14 of 0.1 $\mu$m to 10 $\mu$m thickness formed as a magnetic field sensing portion on a substrate 12 overlaying an organic insulating layer 13, and a multilayer wire bonding electrode including an ohmic electrode 16 formed on a required area of the thin film and a hard metal layer 17 and a bonding layer 18 which are laminated on the ohmic electrode.

8 Claims, 5 Drawing Sheets

MAGNETOELECTRIC TRANSDUCER

This application is a continuation, of application Ser. No. 06/948,053, filed Dec. 31, 1986.

TECHNICAL FIELD

This invention relates to a magnetoelectric transducer such as a Hall element or a magnetoresistance element for conversion of magnetic field or magnetic flux into electrical signals.

BACKGROUND ART

Conventionally, in a magnetoelectric transducer having a magnetic sensor element of group III-V compound semiconductors, such as InSb or GaAs formed on an insulating layer or organic substance, such as polymer, Pb-Sn solder has been used for bonding lead wires and it has been impossible to package the magnetoelectric transducer on a printed wiring board through a process carried out at high temperatures which exceed a melting point of the solder. In recent applications of the magnetoelectric transducer to up-to-date apparatus such as a VTR and a CD player, any packaging process advantageous to mass production is carried out under the environment of high temperatures beyond the solder melting point. Therefore, it is necessarily required to adopt a process for soldering individual elements one by one to a printed wiring board. Accordingly, there has been desired a magnetoelectric transducer which will not be broken through a high temperature process beyond 200° C.

One procedure for meeting, such a demand is such that electrodes are formed on a thin film of group III-V compound semiconductor on an organic insulating layer and wire bonding is effected by using wires of, for example, gold. Conventional techniques fail to permit practical realization of this procedure.

Reasons for this will be described. It has been attempted to form the electrode of the magnetoelectric transducer utilizing the group III-V compound semiconductor by a method in which after an ohmic contact layer is formed on the semiconductor layer, a metal layer of Au, Al or the like well suited for wire bonding is formed by, for example, vapor deposition, and the metal layer is heated to about 300° to 400° C. so that a thin wire of Au, Al or the like can be connected to the metal layer by compression bonding or by using ultrasonic compression bonding in combination. However, when applying the above method to a compound semiconductor film which is formed on a substrate having on its surface an organic insulating layer, two problems as below arise.

The first problem is that the temperature can not be raised sufficiently during bonding. When the temperature of the electrode portion is raised up to 300° to 400° C. as is effected usually, not only exfoliation occurs between the organic insulating layer and the semiconductor film, but also degradation such as carbonization of the organic insulating layer takes place. The exfoliation is due to the fact that the organic insulating layer and the compound semiconductor layer have different thermal expansion coefficients and hence thermal stress is concentrated at the interface between the organic insulating layer and compound semiconductor film when the temperature of the electrode portion is raised beyond 300° C.

The second problem is that since the organic insulating layer is soft, it is more difficult to effect the compression bonding with concentration of the ultrasonic energy on the bonding portion, as compared to a crystal such as Si. Upon compression bonding, the application of a large amount of ultrasonic power is necessarily required with the result that the exfoliation occurs between the organic insulating layer and compound semiconductor film. For these reasons, the conventional wire bonding as applied to the compound semiconductor film on the organic insulating layer has been degraded in yield and its industrial application has been invalid.

At present, ultra-high temperature packaging typically represented by a reflow soldering process has also been demanded. Here, high temperature packaging means that the element is packaged on the printed wiring substrate or the like at about 180° C. to 230° C. and ultra-high temperature packaging means packaging at about 230° C. to 260° C.

Conventionally, the magnetoelectric transducer having a magnetic field sensing portion of group III-V compound semiconductor film formed on the substrate overlaying the organic insulating layer, that is, for example, an InSb Hall element commercially available for use in home-use electrical appliances has very excellent electrical characteristics and high sensitivity by magnetic amplification and the like but faces a problem that it has difficulties with packaging to the printed wiring board through an ultra-high temperature process carried out around 260° C. such as reflow soldering. The formation of the magnetic field sensing portion of semiconductor film on the organic insulating layer provides good adhesion between the two, resulting in advantages that the substrate can be selected freely and that a high-sensitivity characteristic of the element can be obtained, and therefore it is widely used in the production of the magnetoelectric transducers.

Approaches to use a multi-layer electrode with the view of ensuring ohmic contact to the semiconductor layer, preventing electron migration in electrode metal and protecting the semiconductor thin film during solder bonding are referred to in, for example, U.S. Pat. No. 4,081,601 to Donald Dinella et al and U.S. Pat. No. 4,296,424 to the same applicants as the present application. In the patents, however, any organic insulating layer is not used as a base substrate and wire bonding is not taken into consideration.

Accordingly, an object of the present invention is to provide a magnetoelectric transducer having an electrode structure which permits rigid and highly-reliable ultrasonic wire bonding to be applied at high yields to a compound semiconductor thin film formed on an insulating substrate, i.e., a substrate made by itself of an organic insulating material or a substrate overlaying an organic insulating layer.

Another object of the present invention is to provide a highly reliable and highly sensitive magnetoelectric transducer wherein a magnetic field sensing portion formed of a group III-V compound semiconductor film on a substrate overlaying an organic insulating layer has a high heat resistance or high heat resisting property sufficient to withstand thermal shocks caused during ultra-high temperature packaging carried out at about 260° C., thereby permitting automatic packaging.

DISCLOSURE OF INVENTION

In order to obviate the aforementioned prior art drawbacks, the present inventors have studied structures and materials of the electrode from various points of view. As a result, the present invention provides a magnetoelectric transducer comprising a multilayer electrode structure in which an intervening hard metal layer of a large mechanical strength is formed on an ohmic electrode layer and a bonding layer is formed on the hard metal layer, whereby the multilayer electrode structure can reduce or keep to prevent the depression of an underlying organic insulating layer due to its elasticity or softness, said magnetoelectric transducer having highly reliable and rigid wire bonding electrodes suitable for ultrasonic wire bonding and which can be packaged through a high temperature process beyond 200° C.

The present invention provides a magnetoelectric transducer wherein the electrode structure is of a two-layer structure having an ohmic electrode metal layer which is increased in thickness to also serve as an intermediate layer with a requisite mechanical strength, and a bonding layer. Each electrode structure as above enables highly productive and highly reliable wire bonding at low temperatures with low energy ultrasonic power.

According to a feature of the present invention, there is provided a magnetoelectric transducer comprising a group III-V compound semiconductor thin film of 0.1 μm to 10 μm thick as a magnetic field sensing portion formed on a substrate overlaying an organic insulating layer, an ohmic electrode formed on a desired area of the thin film, and a wire-bonding multilayer electrode including a hard metal layer, formed on the ohmic electrode.

According to another feature of the present invention, in the multilayer electrode, the type of material or thickness of the metal layer underlying the wire bonding electrode provides the mechanical strength sufficient to prevent the effect caused by an external bonding force exerted on the metal layer to the organic insulating layer.

According to a further feature of the present invention, in the magnetoelectric transducer with the multilayer electrode, a heat-resisting thin inorganic insulating layer is formed at least between the compound semiconductor thin film and the organic insulating layer, thereby permitting a high temperature packaging process for the transducer. For an ultra-high temperature packaging process carried out around 260° C., thin inorganic insulating layers are formed on both side surfaces of the compound semiconductor thin film.

BEST MODE FOR CARRYING OUT THE INVENTION

Figure 1:
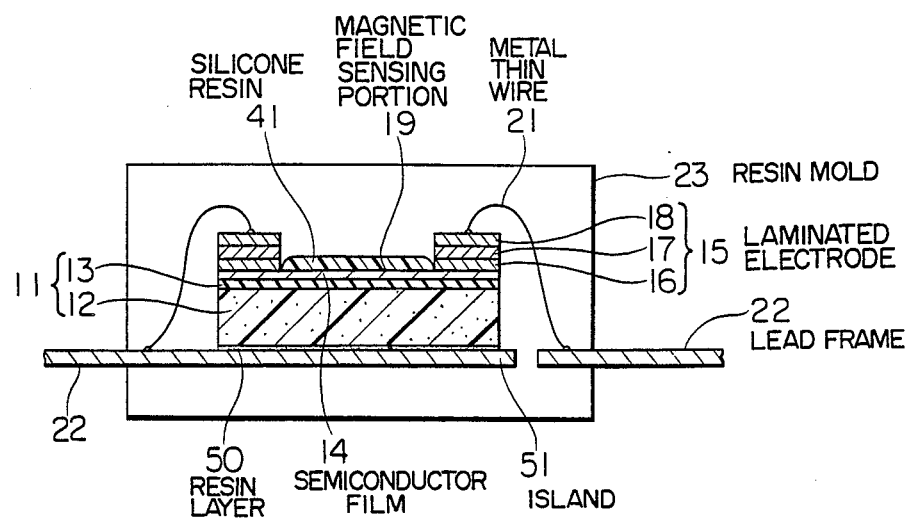
FIG. 1 is a sectional view showing a magnetoelectric transducer according to an embodiment of the present invention.
Figure 2:
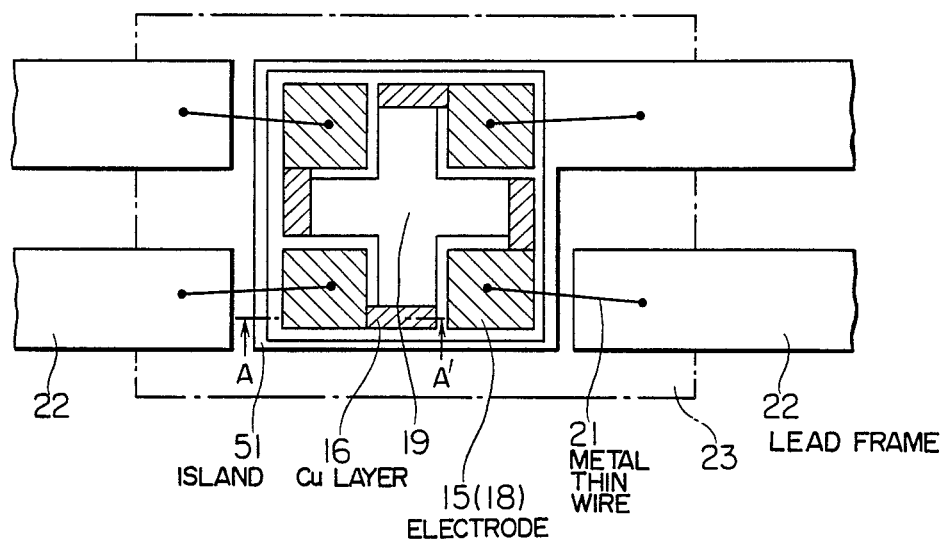
FIG. 2 is a plan view of FIG. 1.

FIGS. 1 and 2 show one embodiment of the construction of a Hall element representative of the magnetoelectric transducer of the present invention. In a sectional view of FIG. 1, an organic insulating layer 13 is formed on a substrate 12 of the Hall element, and a Hall element formed of a compound semiconductor thin film is formed on the layer. More particularly, the compound semiconductor thin film 14 of high electron mobility forming a magnetic field sensing portion is formed on an insulating substrate 11, and electrodes 15 for wire bonding are formed on required areas of the compound semiconductor thin film 14. The electrode 15 comprises three layers including a metal layer 16 making ohmic contact with the compound semiconductor thin film 14, an intermediate metal layer 17 with a large mechanical strength formed on the metal layer 16, and a metal layer 18 forming a bonding layer on the intermediate layer. The thus-laminated layer portion is formed on the entire surface of the ohmic contact metal layer or partial surface thereof at required positions, as desired. A central part of the compound semiconductor thin film 14 between the electrodes forms a magnetic field sensing portion 19 of the Hall element. Protective silicone resin 41 is coated to cover the magnetic field sensing portion 19. In the magnetoelectric transducer of present embodiment having the above wire bonding electrodes, the electrodes 15 are connected by wire bonding to lead frames 22 by thin wires 21 of Au, Al, Cu or alloys thereof. The substrate 12 is adhered to a lead frame 22 through an adhesive resin layer 50. Further, the substrate 11, thin wires 21 and the like, except for edge portions of the lead frames 22, are embedded in a resin mold body 23, for packaging or molding.

FIG. 2 shows the Hall element of FIG. 1 as viewed from above. The bonding pad (electrode) regions are formed in portions 15 extending from each edge of a crucial pattern of the magnetic field sensing portion of the element each of which usually has a minimum area of 100 μm side square and typically a pad area of 150 μm to 400 μm side.

Figure 3A:
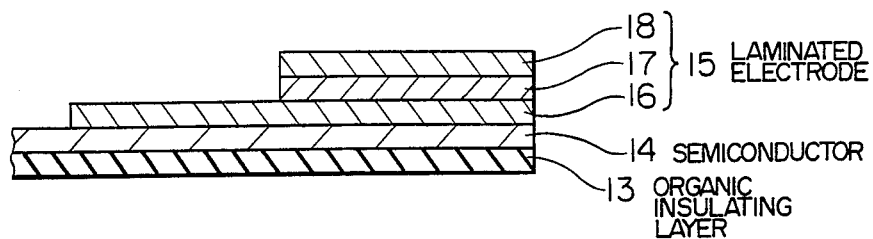
FIGS. 3A to 3D are sectional views showing examples of an electrode structure taken along the line A—A' of FIG. 2.
Figure 3B:
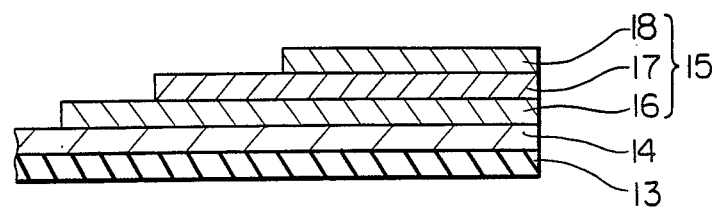
Figure 3C:
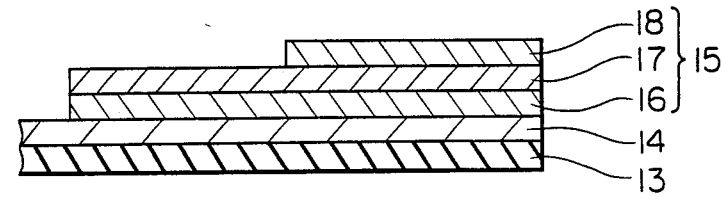
Figure 3D:
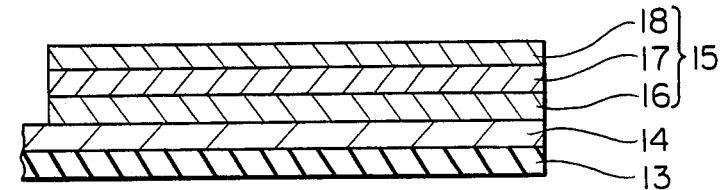

FIGS. 3A to 3D show, in sectional form taken along the line A—A' of FIG. 2, various types of laminated metal electrode structures. FIG. 3A shows a structure wherein regions of the ohmic contact metal layer 16, intermediate metal layer 17 and bonding metal layer 18 are laminated only in the bonding pad region, and FIGS. 3B and 3C show laminated structures wherein in the lamination of FIG. 3A, the intermediate layer 17 extends to the middle of an edge contact area and it extends to cover the entirety of the edge contact area, respectively. FIG. 3D shows an electrode structure wherein the three layers 16, 17 and 18 are all laminated in the same pattern.

Figure 4:
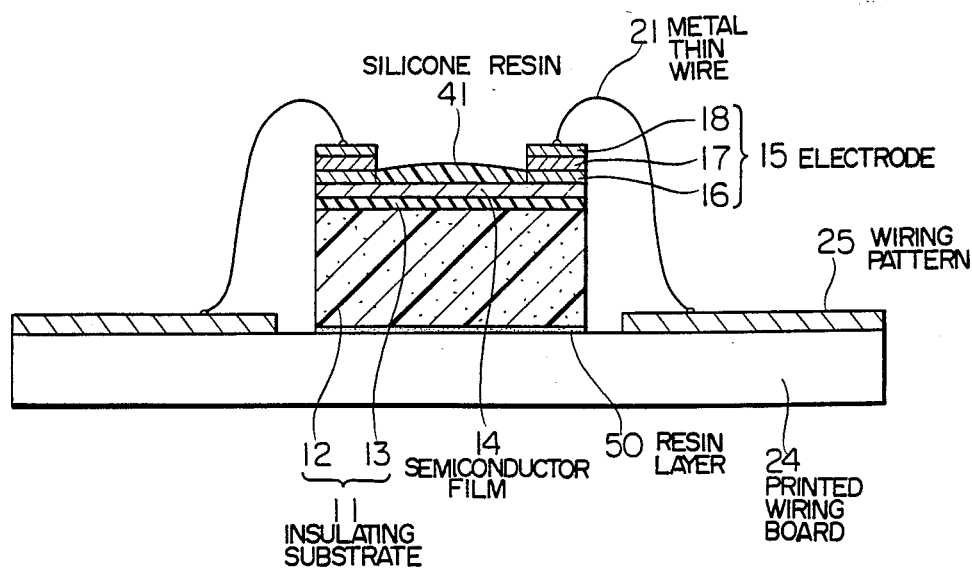
FIGS. 4 and 5 are a sectional view and a plan view, respectively, showing another embodiment of the present invention.
Figure 5:
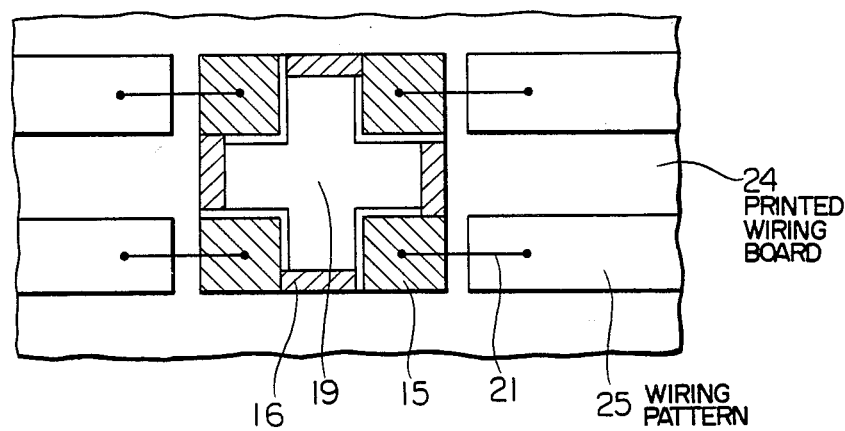

FIGS. 4 and 5 show an embodiment wherein in the arrangement of FIGS. 1 and 2, a Hall element of the present invention is mounted directly to a printed wiring board without resort to the intervening lead frames 22. Thin wires 21 are connected to a wiring pattern 25 formed on the printed wiring board 24.

Figure 6:
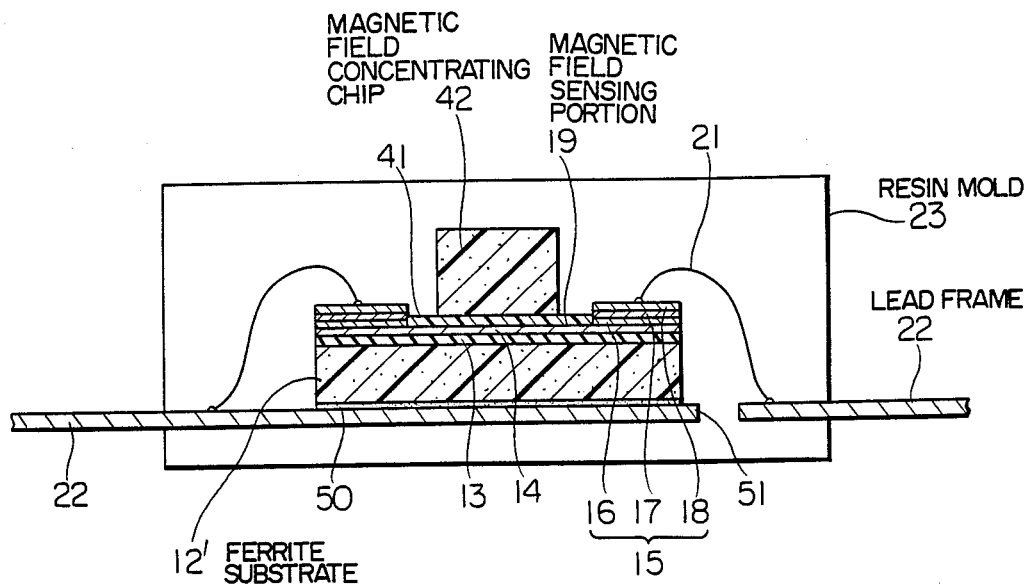
FIG. 6 is a sectional view showing a Hall element with sensitivity enhancing structure according to another embodiment of the present invention.

FIG. 6 shows an embodiment of Hall element of the present invention having a structure in which the magnetic field sensing portion of the magnetoelectric transducer is sandwiched between a ferrite substrate 12' and a magnetic field concentrating chip 42 made of ferrite. The multilayer electrode structure is the same as that of FIG. 1.

Figure 7:
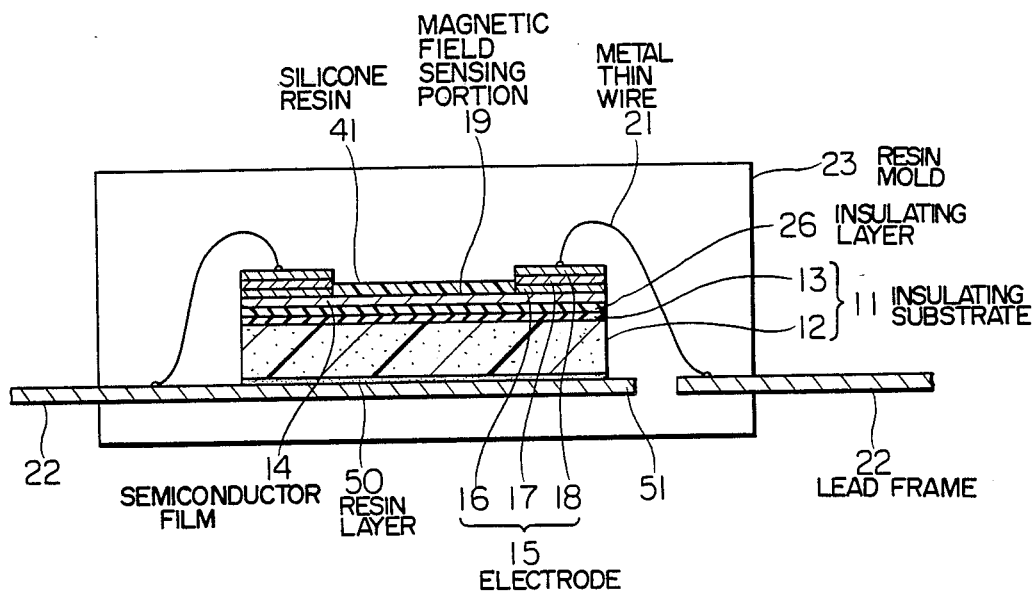
FIG. 7 is a sectional view showing a Hall element having a magnetic field sensing portion with heat-resistant structure according to another embodiment of the present invention.

FIG. 7 shows an embodiment of the Hall element standing for the magnetoelectric transducer of the present invention wherein an inorganic thin insulating layer 26 is formed between the semiconductor layer 14 and the organic insulating layer 13. Since the inorganic thin insulating layer 26 interrupts external heat shocks exerting on the organic insulating layer 13, the heat resistance of the organic insulating layer can be improved to withstand temperatures in the range of from 200° C. to 230° C.

Figure 8:
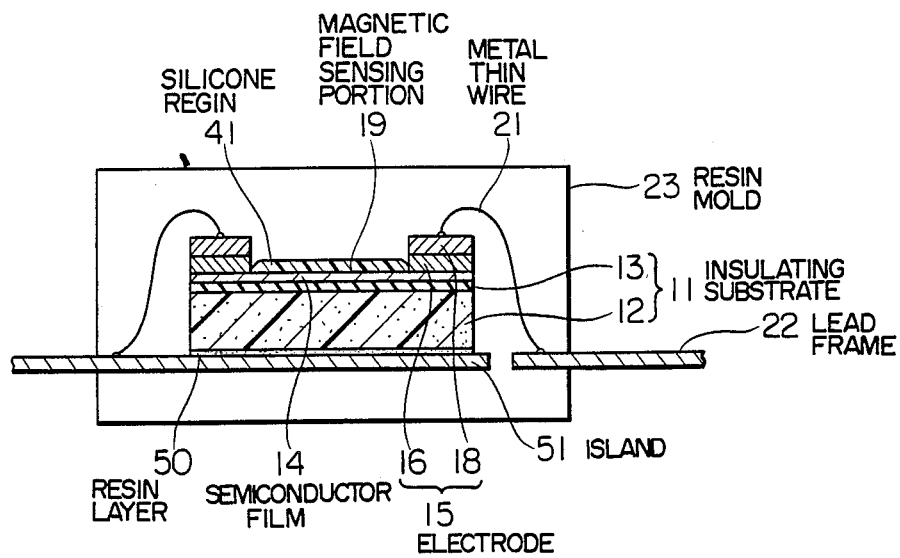
FIG. 8 is a sectional view of a Hall element showing a modification of the present invention.

FIG. 8 shows a modification of the Hall element according to the present invention wherein the thickness of an ohmic contact layer is made twice or more as large as the normal thickness so that the ohmic contact layer also serves as the intermediate layer of FIG. 1 to provide a mechanical strength comparable to that of the intermediate layer. In this case, the wire bonding electrode (pad) is of a two-layer structure.

Figure 9:
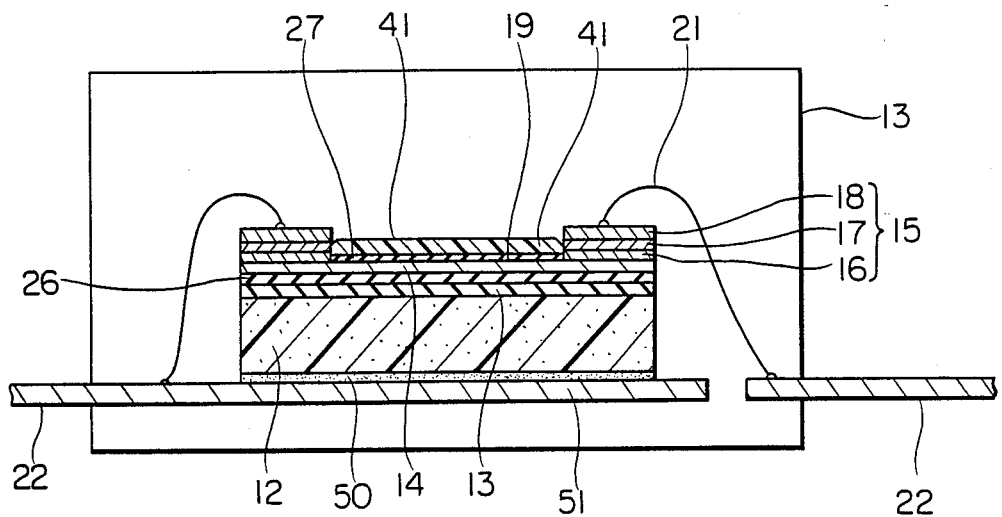
FIG. 9 is a sectional view showing an alternation of the FIG. 7 embodiment.

FIG. 9 shows a fundamental structure of Hall element of the present invention which can withstand thermal shocks due to an ultra-high temperature packaging process, which includes inorganic thin insulating layers 26 and 27.

The surface portion of the Hall element other than the Hall element electrode 15 is all covered with the inorganic thin insulating layer 27. Of course, the inorganic thin insulating layer 27 may overlie only the magnetic field sensing portion 14. The magnetic field sensing portion 14 referred to herein corresponds to a portion which substantially provides a magnetoelectric conversion effect, normally meaning either only a semiconductor thin film portion or a semiconductor thin film portion with auxiliary electrodes such as short bars provided for enhancing the magnetoelectric conversion effect. The silicone resin layer 41 should be provided as desired and may sometimes be omitted.

The embodiment of FIG. 9 is particularly suitable for use in the case where a magnetoelectric transducer having a magnetic field sensing portion formed of a group III-V compound semiconductor thin film containing As is automatically packaged to a printed wiring board through, for example, a reflow soldering process at 260° C., since the characteristics of the transducer will not be affected and thermal breakage will not occur in the transducer during such a packaging process. Accordingly, in comparison with the FIG. 7 embodiment, the present embodiment is especially advantageous to a packaging process at 230° C. or more. In the both embodiments, the intervening inorganic insulating layer acts as a desired thermal insulation protective film to the organic insulating layer and the semiconductor layer of magnetic field sensing portion, but because of a small thickness, it does not affect adhesiveness essentially.

Figure 10:
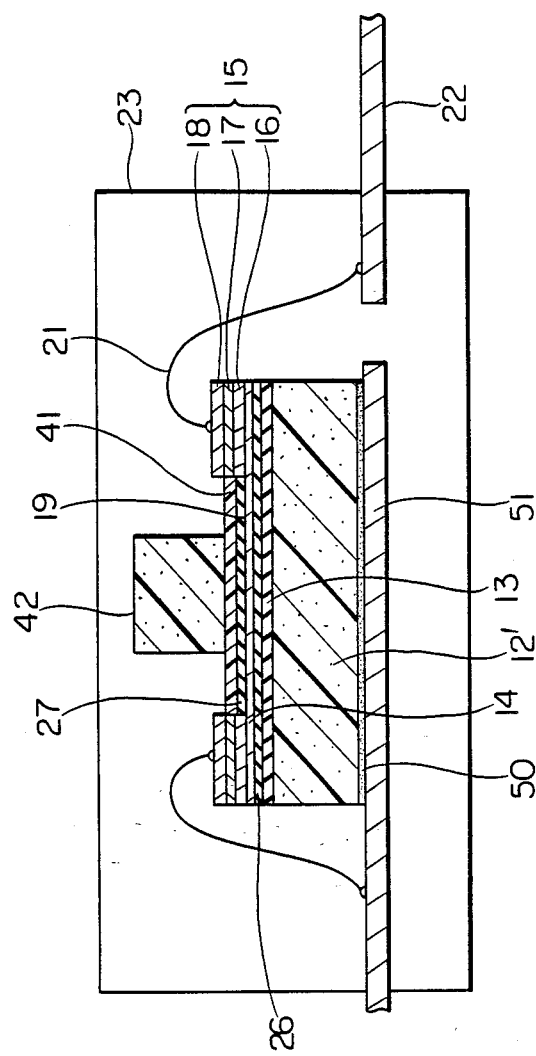
FIG. 10 is a sectional view showing an example wherein a sensitivity enhancing structure is added to the FIG. 9 embodiment.

FIG. 10 shows a modification of the Hall element structure of FIG. 9, in which in addition to improve the heat resistance a magnetic field concentrating chip 42 is disposed on the silicone resin layer 41 to effect magnetic amplification and thereby more enhance the sensitivity of the element. In this case, a soft magnetic material such as soft ferrite is preferably used for the substrate 12.

The magnetic field sensing semiconductor film 14 may preferably be a group III-V compound semiconductor film of high mobility typically used for magnetoelectric transducers and more preferably, it may be formed of a binary or ternary semiconductor material of group III-V compound semiconductor containing any one of In and As or both. Especially, InSb, InAs or InAsP may preferably be used because of its high mobility. The semiconductor film used has an electron mobility in the range of from 2,000 to 80,000 $cm^2/V.sec$ and is a single crystalline or polycrystalline thin film.

For formation of the semiconductor film, an ordinary semiconductor thin film formation process such as LPE, CVD, MOCVD, vapor deposition or MBE may be used. Especially, the MBE process is preferred because it can provide a semiconductor film of good crystallization to ensure high electron mobility in thin film and besides can desirably control the film thickness which is a factor having extremely great influence upon sensitivity of the magnetoelectric transducer.

For formation of individual metal layers of the multilayer electrode, processes ordinarily used for formation of electrodes of semiconductor devices such as electroless plating, electrolytic plating or lift off technique by vapor deposition or sputtering may be used. The thicknesses of the bonding layer 18, intermediate layer 17 and ohmic contact layer 16 are not particularly limited, but they may normally be 0.1 to 30 $\mu$m and preferably 0.1 to 10 $\mu$m. For example, in a laminated electrode having Cu layer 16, Ni layer 17 and Au layer 18, the thickness of each layer may preferably be 2 to 5 $\mu$m.

A material of the ohmic contact metal layer 16 is selected from the group consisting of Cu, Au, Au alloys, Al and Au-Ge alloys, and a material of the intermediate layer 17 providing mechanical strength is selected from the group essentially consisting of Ni, Cu, Cr, Co, Ti, W, Mo and their alloys, and a material of the bonding layer 18 is selected from the group essentially consisting of Au, Al and Al-Si alloys.

As the substrate 12, a substrate used for ordinary magnetoelectric transducers may be used, including a single crystalline or sintered ferrite substrate, a ceramic substrate, a glass substrate, a silicon substrate, a sapphire substrate, a heat-resistant resin substrate and a substrate of a ferro-magnetic material such as iron or permalloy.

As the organic insulating layer 13 on the substrate surface, an insulating layer of resin formed of organic substance may be preferably used.

Typically, the resin insulating layer 13 is preferably used as an adhesive layer acting on the substrate 11 and high mobility semiconductor film 14 and may be formed of ordinarily used resin such as thermosetting epoxy resin, phenol epoxy resin or TVB resin manufactured by Toshiba Ceramic. The thickness of the insulating layer 13 is less than 60 $\mu$m, preferably, less than 10 $\mu$m.

In the magnetoelectric transducer of the present invention, as shown in FIG. 7, the inorganic thin insulating layer 26 may also be interposed between the semiconductor layer of magnetic field sensing portion and the organic insulating layer to prevent impurities from intruding into the semiconductor layer and to relaxedly reduce the external thermal stress. In this case, the inorganic insulating layer includes a thin coating of $SiO_2$, SiO, $Al_2O_3$ or $Si_3N_4$ and its thickness is typically less than 2 μm, preferably, falls within the range of from 500 Å to 10,000 Å.

As shown in FIG. 9, in the magnetoelectric transducer of the present invention, inorganic thin insulating layers may be formed adjacent to the both surfaces of the semiconductor film 14. In this case, the upper inorganic insulating layer 27 is formed of a coating of the same material and thickness range as the lower layer 26.

The presence of such insulating layers 26 and 27 drastically improves the stability of the magnetoelectric transducer during the high temperature process. This is presumably due to the fact that the inorganic thin insulating layers 26 and 27 prevent the intrusion of impurities into the semiconductor film from the organic insulating layer 13 or substrate 12 and besides relaxedly reduce the thermal stress.

The inorganic thin insulating layers 26 and 27 considerably improve the thermal stability of the magnetoelectric transducer during ultra-high temperature packaging process carried out around 260° C., thereby affording high temperature packaging which has been unable to be implemented with the prior art. In addition, each of the inorganic thin insulating layers 26 and 27 may be formed of a multilayer. Preferably, instead of forming an inorganic thin insulating layer from only $Al_2O_3$, a $SiO_2$ layer of 4000 Å may exemplarily be formed on an $Al_2O_3$ layer of 2000 Å to obtain a two-layer which constitutes the upper inorganic thin insulating layer 27, thus improving etching characteristics required for windowing this insulating layer.

Both the insulating layers 26 and 27 may not always be identical in respect of material, composition, layer structure and thickness. For formation of the inorganic thin insulating layers 26 and 27, various types of deposition process may be used, including vapor deposition, sputtering, reactive sputtering, CVD and molecular beam vapor deposition.

The electrode 18 of the magnetoelectric transducer is electrically connected to the lead frame 22 or to the wiring pattern 25 formed on the printed wiring board by a thin wire 21 of Au, Al, Cu or Al-Si alloys used for ordinary wire bonding.

Where connection is made to the printed wiring board 24, a printed wiring board ordinarily used for wiring and packaging of electronic parts may be used as the board 24. Preferably, a thin layer of Au or Ag having good bonding property may be applied on wiring conductors.

Typically, the magnetoelectric transducer of the present invention is packaged with resin mold through transfer molding, for example. The resin mold 23 may be made of resin generally used for molding electronic parts. Preferably, thermosetting resin such as epoxy resin or phenol epoxy resin may be used.

For molding, a molding process ordinarily used for electronic parts may be used including cast molding, transfer molding and a process in which a solid pellet placed on the element is heated to melt and thereafter hardened for molding.

Since, in the magnetoelectric transducer of the present invention, the wire bonding electrode has the multilayer structure which permits the layer underneath the bonding metal layer to have a required mechanical strength, it is possible to form a highly reliable wire bonding junction in the magnetic field sensing semiconductor thin film on the insulating substrate by applying ultrasonic energy of low power at low temperatures of about 200° C.

Yielding of wire bonding which exceeds 99% so as to be highly evaluated from the industrial standpoint is obtained, which permits mass production. In addition, the heat resistance capable of withstanding 230° C. or more during packaging ensures packaging of the element on the printed wiring board through high temperature packaging process.

Moreover, by forming the inorganic insulating layers adjacent to the both side surfaces of the semiconductor thin film as illustrated in the embodiment of FIG. 9 or FIG. 10, the heat resistance of the element can be improved to a great extent with the result that reliability against thermal shocks caused by the ultra-high temperature packaging process such as a reflow soldering process around 230° C. to 260° C. can be ensured, thereby affording applications to the ultrahigh temperature packing process. That is, bonding of the magnetoelectric transducer in a soldering bath maintained at 260° C. can be permitted, resulting in automatic packaging of the magnetoelectric transducer through an automatic assembling process adapted for VTR and the like.

Although in the foregoing embodiments the magnetoelectric transducer of the present invention has been described by way of the Hall element for illustration purpose, it should be understood that the present invention is effectively applicable to all types of semiconductor magnetoelectric transducers such as semiconductor magnetoresistance elements which detect magnetic signals and convert them to produce electrical signals and which utilize the Hall effect and the magnetoresistive effect. Furthermore, it is to be noted that semiconductor magnetoelectric transducers making use of these effects and the other effects in combination may of course fall within the scope of the present invention.

For example, the magnetoresistance element is different from the Hall element in electrode configuration, the number of terminal electrodes and magnetic field sensing portion pattern, but it has electrodes which can be formed in exactly the same way as the Hall element and is identical to the Hall element in the fundamental construction.

The present invention will now be described by way of specified examples, but it should be understood that the present invention is in no way limited to these examples and covers all the magnetoelectric transducers having the basic construction set forth so far.

FIRST EXAMPLE

An InSb thin film of 1 μm thickness and 30,000 $cm^2/V.sec$ electron mobility was formed on a single crystalline mica substrate having a smoothed surface through vacuum vapor deposition to prepare a semiconductor film 14 (FIG. 1). Epoxy resin was coated on the surface of the InSb thin film to a thickness of 10 μm and the coated surface was adhered to a square ceramic substrate (wafer) 12 having a thickness of 0.3 mm and a side of 45 mm. Subsequently, the mica was removed. Thereafter, photoresist was used to form a photoresist coating on the surface of a magnetic field sensing portion of the InSb thin film in an ordinary manner. Then, copper was deposited, to a thickness of 0.3 μm, on only a portion or area which is to form desired electrodes, by electroless plating. To increase the thickness of Cu, electrolytic copper plating was carried out, forming a Cu layer 16 of 2 μm thickness. Subsequently, the photoresist was again used so that a 2 μm thick Ni layer 17 was formed on only an electrode portion of the Cu layer by electrolytic plating. Further, a 2 μm thick Au layer 18 was formed on the Ni layer 17 by electrolytic plating. Thereafter, the photoresist was again used so that unwanted InSb thin film and an unwanted part of Cu were etched off with hydrochloric acid solution of ferric chloride by photolithography techniques, thus forming a pattern for a plurality of unit Hall elements each including a magnetic field sensing portion and four electrode portions (FIG. 2). Each laminated bonding electrode had an area of 150 μm×150 μm. Then, silicone resin was coated directly on the magnetic field sensing portion to form a protective film 41. Subsequently, the wafer was cut by a dicing cutter to prepare a plurality of Hall element pellets each being of 1.1 mm×1.1 mm square. Each pellet was adhered to an island 51 of a lead frame 22 by using a resin layer 50. The electrodes 15 of the pellet were then connected with lead frames 22 by Au thin wires 21 of 25 to 30 μm diameter in atmosphere at 200° C. under the application of an ultrasonic output voltage of 26 to 34 V by using a high speed automatic ultrasonic thermal compression wire bonder, type FB 105 R, manufactured by Kaijyo Denki-Ltd. Thereafter, the element assembly was packaged with epoxy resin by transfer molding, with the leads exposed to be outside partially.

The thus-fabricated Hall element was tested to prove that the surface temperature of the Au electrode portion was allowed to be a lower limit of 100° C. for bonding and under this condition, the percentage of defective wire bonds was 0.13%.

The ultrasonic energy at a normal level could be applied without causing any inconvenience and trouble. In other words, it was found that even with the organic insulating layer 13, wire bonding could be carried out under the standard condition of automatic wire bonding at sufficiently high yield, proving that the present invention is available for industrial mass production techniques. After bonding, the bonded wire was checked for bonding strength under a criterion that the bonding strength was 2g or more per wire for acceptable bonding.

The Hall element thus subjected to wire bonding was molded through transfer molding, without causing any defective due to insufficient bonding strength of Au wires. When the thus fabricated Hall element standing for a magnetoelectric transducer of the present invention was subjected to thermal shocks for three minutes in atmosphere at 230° C., the characteristics of the element remained almost unchanged with the only exception of a change in electric resistance by −2.1%, proving that the element, even with the organic insulating layer, could withstand considerable thermal shocks during packaging in contrast to the fact that all the electrodes of conventional Hall elements made by solder bonding caused wire disconnection and broken out.

SECOND EXAMPLE

An InAs film of 1.2 μm thickness and 10,000 cm$^2$/V.sec electron mobility was formed on a mica substrate having a smoothed surface through MBE process (molecular beam epitaxy process).

Subsequently, epoxy resin was coated on the surface of the InAs film and an InAs thin film 14 was adhered to a square ceramic substrate 12 having a thickness of 0.3 mm and a side of 45 mm in the same manner as the first example. Thereafter, a Hall element was prepared in exactly the same manner as the first example. In this case, the percentage of defective wire bonding by the automatic wire bonder was exactly equal to that of the first example, amounting to 0.13%. During transfer molding, breakage did not occur at the junctions of Au wires.

Like the first example, the element of this example proved to keep its characteristics unchanged through a thermal shock test carried out for three minutes in atmosphere at 230° C. and to be sufficiently durable against packaging to the printed wiring board even at 230° C.

THIRD EXAMPLE

An InSb thin film of 1 μm thickness and 30,000 cm$^2$/V.sec electron mobility was formed on a single crystalline mica substrate having a smoothed surface through vacuum vapor deposition to prepare a semiconductor film 14. Epoxy resin was coated on the surface of the InSb thin film and the epoxy resin coated surface was adhered to a square ferrite substrate 12 (wafer) having a thickness of 0.3 mm and a side of 45 mm (FIG. 6). Subsequently, the mica was removed. Thereafter, photoresist was used to form a photoresist coating on the surface of a magnetic field sensing portion of the InSb thin film in an ordinary manner. Then, copper was deposited, to a thickness of 0.3 μm, on only a required area by electroless plating. To increase the thickness of Cu, electrolytic copper plating was carried out, forming a Cu layer 16 of 2 μm thickness. Subsequently, the photoresist was again used so that a 2 μm thick Ni layer 17 was formed on only a wire-bonding electrode portion by electrolytic plating. Further, a 2 μm thick Au layer 18 was formed on the Ni layer through electrolytic plating. Thereafter, the photoresist was again used so that unwanted InSb thin film and an unwanted part of Cu were etched off with hydrochloric acid solution of ferric chloride through photolithography techniques, thus forming a pattern for a plurality of unit Hall elements each composed of a magnetic field sensing portion and four electrode portions. A magnetic field concentrating chip 42 of ferrite was then adhered directly to the magnetic field sensing portion by silicone resin 41. Subsequently, this wafer was cut by the dicing cutter to prepare a plurality of Hall element pellets, each being of 1.1 mm×1.1 mm square. Each pellet was then adhered to an island 51 of a lead frame 22. Subsequently, the electrodes 15 of the pellet were connected with lead frames 22 by Au thin wires 21 in the same manner as the first example by using the high speed automatic ultrasonic wire bonder. The thus-formed element was packaged with epoxy resin by transfer molding.

The percentage of defective wire bonding of the Hall elements thus fabricated in accordance with the present invention remained unchanged as compared to the first example. The heat resistance tested by thermal shocks for three minutes in atmosphere at 230° C. proved to be comparable to the first example.

FOURTH EXAMPLE

An InAs thin film of 1.2 μm thickness and 10,000 cm$^2$/V.sec electron mobility was formed on a mica substrate having a smoothed surface through MBE process (molecular beam epitaxy process). Epoxy resin was coated on the surface of the InAs film to a thickness of 5 μm and an InAs thin film was adhered to a square ferrite substrate 12' having a thickness of 0.3 mm and a side of 45 mm. Thereafter, a Hall element was fabricated in exactly the same manner as the third example (FIG. 6). When the thus-fabricated Hall element was subjected to wire bonding of Au wires by using the high speed automatic ultrasonic wire bonder, the percentage of defective wire bonds remained unchanged as compared to the first example, amounting to 0.13%. A thermal shock test is carried out for three minutes at 230° C. proved that the heat resistivity was comparable to that of the second example.

FIFTH EXAMPLE

An InSb thin film of 1 μm thickness and 30,000 cm²/V.sec electron mobility was formed on a single crystalline mica substrate having a smoothed surface through vacuum vapor deposition to prepare a semiconductor film 14. Subsequently, an Al$_2$O$_3$ film of 3,000 Å thickness was formed on the InSb thin film through vacuum vapor deposition. Epoxy resin was coated on the surface of the Al$_2$O$_3$ thin film and the coated surface was adhered to a square ferrite substrate 12' (wafer) having a thickness of 0.3 mm and a side of 45 mm. Subsequently, the mica was removed. Thereafter, photoresist was used to form a photoresist coating on the surface of a magnetic field sensing portion of the InSb thin film in an ordinary manner. Then, copper was deposited to a thickness of 0.3 μm in a required pattern through electroless plating. To increase the thickness of Cu, electrolytic copper plating was carried out, forming a Cu layer 16 of 2 μm thickness. Subsequently, the photoresist was again used to form a 2 μm thick Ni layer 17 on only a wire bonding electrode portion by electrolytic plating. Further, a 2 μm thick Au layer 18 was formed on the Ni layer by electrolytic plating. Thereafter, the photoresist was again used so that unwanted InSb thin film and an unwanted part of Cu were etched off with hydrochloric acid solution of ferric chloride using photolithography techniques, thus forming a pattern for a plurality of unit Hall elements each composed of a magnetic field sensing portion and four electrode portions (FIG. 7). A magnetic field concentrating chip 42 of ferrite was then adhered directly to the magnetic field sensing portion by silicone resin (FIG. 7). Subsequently, this wafer was cut by the dicing cutter to prepare a plurality of Hall element pellets each having a square shape of 1.1 mm×1.1 mm. Each pellet was then adhered to an island 51 of a lead frame 22 through a resin layer 50. Subsequently, the electrodes 15 of the pellet were connected with lead frames 22 by Au thin wires 21 in the same manner as the first example by using the high speed wire bonder. The thus-formed element was packaged with epoxy resin by transfer molding.

When the Hall element thus fabricated in accordance with the present invention was subjected to ultrasonic thermal compression wire bonding by using the automatic bonder, the percentage of defective remained unchanged as compared to the first example, amounting to 0.13%. A thermal shock test carried out for three minutes at 230° C. proved that the characteristics of the elements of this example remained almost unchanged. In this connection, the element of this example proved to be more improved than the first example element. It was also proven that the element could be packaged at 230° C. without causing any difficulty.

SIXTH EXAMPLE

The sixth example will be described by referring to FIG. 9. An InAs film having a thickness of 1.2 μm, an electron mobility of 8500 cm²/V.sec at room temperature and an electron concentration of $3 \times 10^{16}$ cm$^{-3}$ was formed on a mica substrate having a smoothed surface through MBE process (molecular beam epitaxy process) to prepare a semiconductor film 14. Subsequently, an Al$_2$O$_3$ layer was formed, to a thickness of 4000 Å, on the semiconductor film through vacuum vapor deposition to prepare an inorganic thin insulating layer 26. Epoxy resin was then coated on the surface of the thin film and the coated surface was adhered to a square alumina substrate 12 (wafer) of 0.3 mm thickness and 50 mm side, forming an organic insulating layer 13 of epoxy resin. Subsequently, the mica was removed. Thereafter, photoresist was used to form a photoresist coating on the surface of a magnetic field sensing portion of the InAs thin film in an ordinary manner. Then, copper was deposited, to a thickness of 0.3 μm, on only a required portion. To increase the thickness of Cu, electrolytic copper plating was carried out, forming a Cu layer 16 of 2 μm thickness. Subsequently, the photoresist was again used so that a 2 μm thick Ni layer 17 was formed on only an electrode portion by electrolytic plating. Further, a 2 μm thick Au layer 18 was formed on the Ni layer by electrolytic plating. Thereafter, the photoresist was again used so that unwanted InAs thin film and an unwanted part of Cu were etched off with hydrochloric acid solution of ferric chloride through photolithography techniques, thus forming a pattern for a plurality of unit Hall elements each including a magnetic field sensing portion 19˜and four electrode portions. An Al$_2$O$_3$ layer of 2000 Å thickness was then formed on the pattern through vacuum vapor deposition to prepare an inorganic thin insulating layer 27. Thereafter, unwanted Al$_2$O$_3$ on the electrodes 15 of the Hall element was etched off with ammonium fluoride solution through photolithography techniques.

Subsequently, the wafer was cut into square Hall element pellets by means of the dicing cutter. Each pellet was then adhered to an island 51 of a lead frame 22. Thereafter, the electrodes 15, especially, bonding metal layers 18 of the Hall element were connected with lead frames 22 by Au thin wires 21 by using the high speed automatic ultrasonic wire bonder in the same manner as the first example, and the element was packaged with epoxy resin by transfer molding. After the thus fabricated Hall element was tested under an ultrahigh temperature packaging condition (for five minutes in solder bath at 260° C.), the input resistance was changed at a rate of −2.7%, indicating that the level of change did not raise any difficulty in practical use. It was not until sufficient cooling following the test that the resistance value after the heat test was measured. The characteristics of the element except the resistance remained almost unchanged. Thus, it was found that the heat resistance of the Hall element was drastically improved by sandwiching the semiconductor film 14 with the thin insulating layers of Al$_2$O$_3$. Accordingly, it was found that the element can be packaged by a reflow soldering process at 260° C.

SEVENTH EXAMPLE

The seventh example will be explained with reference to FIG. 10. An inorganic thin insulating layer 26 was formed on the InAs film on the same mica substrate as that of the sixth example in the same manner as the sixth example. Subsequently, epoxy resin was coated on the surface of the thin film and the coated surface was adhered to a square ferrite substrate (wafer) 12' of 0.3 mm thickness and 50 mm side, forming an organic insulating layer 13. The mica was then removed. Thereafter, a magnetic field sensing portion 19 and four electrode portions 15 of each Hall element were formed on the substrate 12' in the same manner as the sixth example. Next, an inorganic thin insulating layer 27 was formed on the surface of the wafer, except for the electrodes 15 of the Hall element, in the same manner as the sixth example. Thereafter, a magnetic field concentrating chip 42 of ferrite was adhered directly to the magnetic field sensing portion 19 by silicone resin.

The element was then assembled in the same manner as the sixth example. After the thus-fabricated Hall element was tested under an ultra-high temperature packaging condition (for five minutes in atmosphere at 260° C.), the input resistance was changed at a rate of −1.9%, indicating that the level of change did not cause any difficulty in practical use. After sufficient cooling following the test the electrical resistance value after the heat test was measured. The characteristics of the element except for the electrical resistance remained almost unchanged. Thus, it was found that the heat resistivity of the Hall element was drastically improved by sandwiching the magnetic field sensing semiconductor film 14 with the thin insulating layers 26 and 27 of $Al_2O_3$. Thus, a highly reliable magnetoelectric transducer was provided which was suitable for industrial mass production, for example, under the reflow soldering process and which could sufficiently withstand the high temperature packaging process.

EIGHTH EXAMPLE

The eighth example will be described with reference to FIG. 8. An InSb thin film of 1 μm thickness and 30,000 $cm^2$/V.sec electron mobility was formed on a single crystalline mica substrate having a smoothed surface to prepare a semiconductor film 14. Subsequently, an $Al_2O_3$ film of 3,000 Å thickness was formed on the film 14 through vacuum vapor deposition (not shown). Epoxy resin was coated on the surface of the $Al_2O_3$ thin film and the coated surface was adhered to a square ferrite substrate (wafer) 12' of 0.3 mm thickness and 45 mm side substituting for the ceramic substrate 12. The mica was then removed. Thereafter, photoresist was used to form a photoresist coating on the surface of a magnetic field sensing portion of the InSb thin film in an ordinary manner. Then, copper was deposited, to a thickness of 0.3 μm, on only a required portion through electroless plating. To increase the thickness of Cu, electrolytic copper plating was carried out, forming a Cu layer 16 of 5 μm thickness.

Further, an Au layer 18 of 2 μm thickness was formed on the Cu layer by electrolytic plating (electrode structure of FIG. 8). Subsequently, the photoresist was again used so that an unwanted InSb thin film and an unwanted part of copper were etched off with hydrochloric acid solution of ferric chloride through photolithography techniques, thus forming a pattern for a plurality of unit Hall elements each including a magnetic field sensing portion and four electrode portions. Silicone resin was then coated directly to the magnetic field sensing portion to form a protective film 41. Subsequently, this wafer was cut into a plurality of Hall element pellets each having a square shape of 1.1 mm × 1.1 mm by the dicing cutter. Each pellet was then adhered to an island 51 of a lead frame 22. Subsequently, the electrodes 15 of the Hall element were connected with lead frames 22 by Au thin wires 21 in the same manner as the first example by using the high speed wire bonder. The element was packaged with epoxy resin by transfer molding.

The percentage of defective due to wire bonding of the Hall elements thus-fabricated in accordance with the present invention was a 0.16% which was substantially equal to that of the first example. In this example, fabrication process could advantageously be shortened by eliminating nickel plating and prolonging the time for electrolytic copper plating. The heat resistivity of the element according to this example was the same as that of the third example.

INDUSTRIAL APPLICABILITY

As described above, the magnetoelectric transducer according to the present invention is useful for use as various motor speed control circuits and position sensors and especially suitable for use as a contactless miniature detecting means for speed control of VTR motors, hard magnetic disk drive motors, CD player motors, micro-cassette tape recorder motors and floppy disc drive motors.

We claim:

1. A compound semiconductor magnetoelectric transducer comprising:
    a substrate and an organic insulating layer overlaying said substrate;
    a group III-V compound semiconductor layer of 0.1 to 10μm thickness disposed on said substrate and having a predetermined pattern to provide a magnetic field sensing portion;
    a plurality of electrodes each formed of a laminated stack of three metal layers;
    the first metal layer of said laminated stack being continuous to and in ohmic contact with said semiconductor layer and made of a material selected from the group consisting of Cu, Au, Au alloys and Au-Ge alloys;
    the intermediate layer of said laminated stack providing a mechanical strength above a predetermined value and being formed on said first metal layer and made of a material selected from the group consisting of Ni, Cu and their alloys;
    the third layer of said laminated stack being provided for wire bonding and being formed on said intermediate layer and made of Au; and
    said first metal layer, said intermediate metal layer and said third layer each having a thickness of between about 2–5 μm.

2. The compound semiconductor magnetoelectric transducer as set forth in claim 1 wherein said mechanical strength providing metal layer and said bonding surface providing metal layer comprise a single metal layer, disposed immediately below and adjacent to said wire bonding electrode, in ohmic contact with said compound semiconductor layer, said single metal layer having a thickness sufficient to resist at least an ultrasonic bonding force.

3. The compound semiconductor magnetoelectric transducer as set forth in claim 1 including an inorganic thin insulating layer disposed between said compound semiconductor layer and said organic insulating layer.

4. The compound semiconductor magnetoelectric transducer as set forth in claim 1 including first and second inorganic thin insulating layers disposed adjacent to the upper and lower surfaces of said compound semiconductor layer to sandwich said compound semiconductor layer therebetween.

5. The compound semiconductor magnetoelectric transducer as set forth in claim 1 wherein said compound semiconductor layer is formed of a group III-V compound semiconductor of high electron mobility containing arsenic.

6. The compound semiconductor magnetoelectric transducer as set forth in claim 1 wherein said compound semiconductor layer contains at least one of InSb, InAs and InAsP.

7. The compound semiconductor magnetoelectric transducer as set forth in claim 4 wherein said inorganic insulating layer has a thickness of 500 Å to 2 μm.

8. The compound semiconductor magnetoelectric transducer as set forth in claim 1 wherein said substrate is formed of ferrite or ceramics.

* * * * *